US012666875B2

(12) United States Patent
Kuroda et al.

(10) Patent No.: US 12,666,875 B2
(45) Date of Patent: Jun. 23, 2026

(54) PIEZOELECTRIC FILM, PIEZOELECTRIC STACK, PIEZOELECTRIC ELEMENT, AND METHOD FOR PRODUCING PIEZOELECTRIC STACK

(71) Applicant: SUMITOMO CHEMICAL COMPANY, LIMITED, Tokyo (JP)

(72) Inventors: Toshiaki Kuroda, Hitachi (JP); Kenji Shibata, Hitachi (JP); Kazutoshi Watanabe, Hitachi (JP); Takeshi Kimura, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 958 days.

(21) Appl. No.: 17/908,899

(22) PCT Filed: Feb. 24, 2021

(86) PCT No.: PCT/JP2021/006768
§ 371 (c)(1),
(2) Date: Sep. 1, 2022

(87) PCT Pub. No.: WO2021/177091
PCT Pub. Date: Sep. 10, 2021

(65) Prior Publication Data
US 2024/0206342 A1      Jun. 20, 2024

(30) Foreign Application Priority Data
Mar. 5, 2020      (JP) ................................ 2020-037496

(51) Int. Cl.
*H10N 30/00*      (2023.01)
*C30B 28/12*      (2006.01)
(Continued)

(52) U.S. Cl.
CPC ......... *H10N 30/8542* (2023.02); *C30B 28/12* (2013.01); *C30B 29/02* (2013.01);
(Continued)

(58) Field of Classification Search
CPC ............. H10N 30/8542; H10N 30/076; H10N 30/708; C30B 28/12; C30B 29/02;
(Continued)

(56) References Cited

U.S. PATENT DOCUMENTS

2007/0126313 A1      6/2007   Ueno et al.
2009/0236944 A1      9/2009   Shibata et al.
(Continued)

FOREIGN PATENT DOCUMENTS

JP         2007-184513 A      7/2007
JP         2008-159807 A      7/2008
(Continued)

OTHER PUBLICATIONS

International Preliminary Report on Patentability, dated Sep. 15, 2022, which includes an English-language translation of the Written Opinion issued in the corresponding International Patent Application No. PCT/JP2021/006768, dated Jun. 1, 2021.
(Continued)

*Primary Examiner* — Julio C. Gonzalez
(74) *Attorney, Agent, or Firm* — Foley & Lardner LLP

(57)      ABSTRACT

There is provided a piezoelectric film, being a polycrystalline film comprised of potassium sodium niobate; containing at least one metal element selected from a group consisting of Cu and Mn; and having 1.0 or less ratio of a concentration B of the metal element at grain boundaries of crystals, with respect to a concentration A of the metal element in a matrix phase of the crystals.

16 Claims, 2 Drawing Sheets

(51) Int. Cl.

| | | |
|---|---|---|
| *C30B 29/02* | (2006.01) | |
| *C30B 29/30* | (2006.01) | |
| *C30B 29/68* | (2006.01) | |
| *H10N 30/076* | (2023.01) | |
| *H10N 30/853* | (2023.01) | |

(52) U.S. Cl.
CPC .............. *C30B 29/30* (2013.01); *C30B 29/68* (2013.01); *H10N 30/076* (2023.02)

(58) Field of Classification Search
CPC ... C30B 29/30; C30B 29/68; C04B 35/62675; C04B 2235/3201; C04B 2235/40; C04B 2235/407; C04B 2235/785; C04B 35/495; C04B 35/6262; C23C 14/088; H03H 3/02; H03H 9/02015
See application file for complete search history.

(56) References Cited

U.S. PATENT DOCUMENTS

| | | | | |
|---|---|---|---|---|
| 2014/0218588 | A1* | 8/2014 | Ifuku .................. | H04N 23/811 |
| | | | | 348/340 |
| 2014/0265723 | A1* | 9/2014 | Aida ........................ | B41J 2/045 |
| | | | | 347/68 |
| 2020/0243748 | A1* | 7/2020 | Hirose ............. | C04B 35/62695 |
| 2020/0388746 | A1 | 12/2020 | Shibata et al. | |

FOREIGN PATENT DOCUMENTS

| | | | |
|---|---|---|---|
| JP | 2014-179609 | A | 9/2014 |
| JP | 2017-157830 | A | 9/2017 |
| JP | 2018-207055 | A | 12/2018 |
| JP | 2019-176514 | A | 10/2019 |
| WO | WO-2018/180770 | A1 | 10/2018 |

OTHER PUBLICATIONS

International Searching Authority, "International Search Report," issued in connection with International Patent Application No. PCT/JP2021/006768, dated Jun. 1, 2021.

International Searching Authority, "Written Opinion," issued in connection with International Patent Application No. PCT/JP2021/006768, dated Jun. 1, 2021.

European Extended Search Report issued in corresponding European Patent Application No. 21764150.5 dated Mar. 5, 2024 (9 pages).

Sheng et al., "Annealing effects on the structure and properties of Mn-doped (K0.48Na0.52)NbO3 lead-free piezoceramics", Journal of Material Science: Materials in Electronics, vol. 29, No. 13, May 5, 2018, pp. 11306-11313.

* cited by examiner

PIEZOELECTRIC FILM, PIEZOELECTRIC STACK, PIEZOELECTRIC ELEMENT, AND METHOD FOR PRODUCING PIEZOELECTRIC STACK

CROSS-REFERENCE TO RELATED APPLICATIONS

The present application claims priority under 37 U.S.C. § 371 to International Patent Application No. PCT/JP2021/006768, filed Feb. 24, 2021, which claims priority to and the benefit of Japanese Patent Application No. 2020-037496, filed on Mar. 5, 2020. The contents of these applications are hereby incorporated by reference in their entireties.

TECHNICAL FIELD

The present disclosure relates to a piezoelectric film, a piezoelectric stack, a piezoelectric element, and a method for producing a piezoelectric stack.

DESCRIPTION OF THE RELATED ART

Piezoelectric materials are widely used in functional electronic components such as sensors and actuators. Widely used piezoelectric materials include lead-based materials, particularly PZT-based ferroelectrics represented by a composition formula $Pb(Zr_{1-x}Ti_x)O_3$. PZT-based piezoelectric materials contain lead and therefore not preferable from a viewpoint of pollution prevention, for example. In view of this, potassium sodium niobate (KNN) has been proposed as a piezoelectric material not containing lead (e.g., see Patent Documents 1 and 2). In recent years, there has been a strong demand to further improve a performance of the piezoelectric materials comprised of a material not containing lead such as KNN.

PRIOR ART DOCUMENT

Patent Document

Patent Document 1: Japanese Patent Laid Open Publication No. 2007-184513
Patent Document 2: Japanese Patent Laid Open Publication No. 2008-159807

SUMMARY

Problems to be Solved by Disclosure

An object of the present disclosure is to provide a piezoelectric film less likely to crack, the piezoelectric film being comprised of potassium sodium niobate.

Means for Solving Problem

According to an aspect of the present disclosure, there is provided a piezoelectric film, and related technique thereof, being a polycrystalline film comprised of potassium sodium niobate;
    containing at least one metal element selected from a group consisting of Cu and Mn; and
    having 1.0 or less ratio of a concentration B of the metal element at grain boundaries of crystals, with respect to a concentration A of the metal element in a matrix phase of the crystals.

Advantage of Disclosure

According to the present disclosure, a piezoelectric film less likely to crack can be obtained, the piezoelectric film being comprised of potassium sodium niobate.

DETAILED DESCRIPTION

Embodiment of the Present Disclosure

Figure 1:
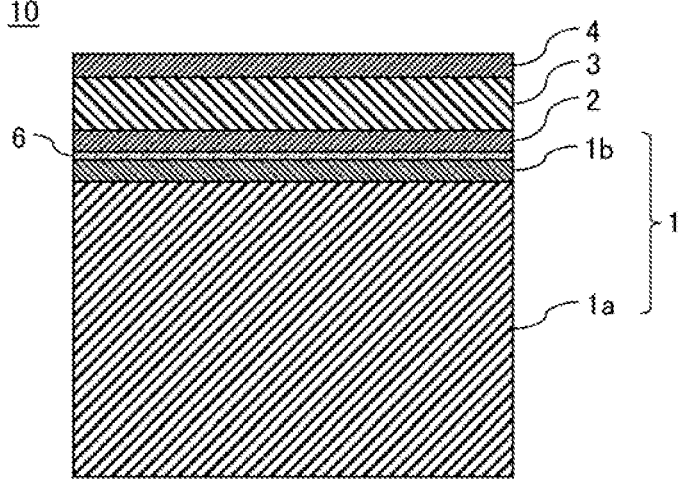
FIG. 1 is a view illustrating an example of a cross-sectional structure of a piezoelectric stack according to an embodiment of the present disclosure.
Figure 2:
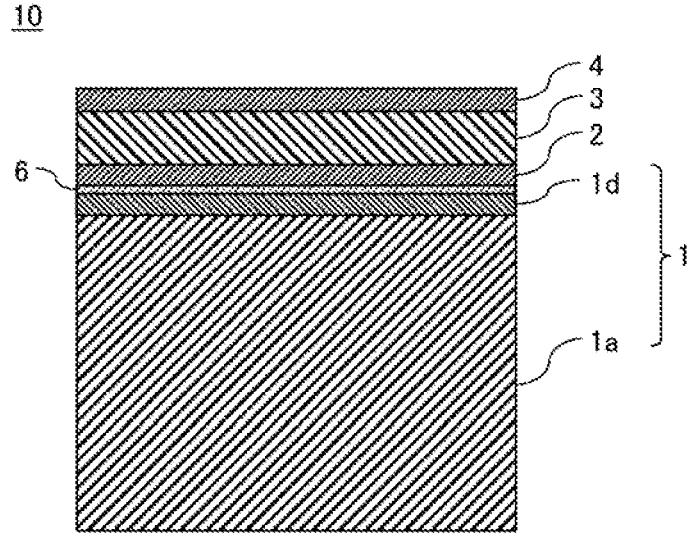
FIG. 2 is a view illustrating a modified example of the cross-sectional structure of the piezoelectric stack according to the embodiment of the present disclosure.

Hereinafter, an embodiment of the present disclosure will be described with reference to the drawings.
(1) Configuration of Piezoelectric Stack
    As illustrated in FIG. 1, a stack (stacked substrate) 10 (hereinafter also referred to as piezoelectric stack 10) having a piezoelectric film according to the present embodiment includes a substrate 1, a bottom electrode film 2 as a first electrode film provided (deposited) on the substrate 1, a piezoelectric film (piezoelectric thin film) 3 provided (deposited) on the bottom electrode film 2, and a top electrode film 4 as a second electrode film provided (deposited) on the piezoelectric film 3.
    The substrate 1 can preferably be a single-crystal silicon (Si) substrate 1a on which a surface oxide film ($SiO_2$-film) 1b such as a thermal oxide film or a CVD (Chemical Vapor Deposition) oxide film is formed, i.e., a Si-substrate having the surface oxide film. Alternatively, the substrate 1 can be a Si-substrate 1a having an insulating film 1d formed on a surface thereof, the insulating film 1d being formed of an insulating material other than $SiO_2$, as illustrated in FIG. 2. Alternatively, the substrate 1 can be the Si-substrate 1a in which Si-(100), Si-(111), or the like, is exposed from the surface thereof, i.e., a Si-substrate not having the surface oxide film 1b or the insulating film 1d. Alternatively, the substrate 1 can be an SOI (Silicon-On-Insulator) substrate, a quartz glass ($SiO_2$) substrate, a gallium arsenide (GaAs) substrate, a sapphire ($Al_2O_3$) substrate, or a metal substrate formed of a metallic material such as stainless steel (SUS). A thickness of the single-crystal Si-substrate 1a can be, for example, 300 μm or more and 1000 μm or less. A thickness of the surface oxide film 1b can be, for example, 1 nm or more and 4000 nm or less.
    The bottom electrode film 2 can be deposited using platinum (Pt), for example. The bottom electrode film 2 is a single-crystal film or a polycrystalline film (collectively also referred to as Pt-film hereinafter). Preferably, crystals constituting the Pt-film are preferentially oriented in (111) direction with respect to the surface of the substrate 1. That is, a surface of the Pt-film (a surface to be a base of the piezoelectric film 3) is preferably mainly constituted by Pt-(111). The Pt-film can be deposited by a method such as a sputtering method or a vapor deposition method. The bottom electrode film 2 may be deposited using, in place of Pt, various metals such as gold (Au), ruthenium (Ru), or iridium (Ir), alloys containing these as main components, metal oxides such as strontium ruthenium oxide ($SrRuO_3$; abbreviated as SRO) and lanthanum nickel oxide ($LaNiO_3$; abbreviated as LNO), or the like. Alternatively, the bottom electrode film 2 may be a single-layer film deposited using the above-listed various metals or metal oxides; a stack including a Pt-film and a film comprised of SRO provided on the Pt-film; a stack including a Pt-film and a film comprised of LNO provided on the Pt-film; or the like. An adhesion layer 6 mainly containing, for example, titanium (Ti), tantalum (Ta), titanium oxide ($TiO_2$), nickel (Ni), ruthenium oxide ($RuO_2$), iridium oxide ($IrO_2$), or the like may also be provided between the substrate 1 and the bottom electrode film 2 in order to enhance an adhesiveness between them. The adhesion layer 6 can be deposited by a method such as the sputtering method or the vapor deposition method. A thickness of the bottom electrode film 2 can be, for example, 100 nm or more and 400 nm or less. A thickness of the adhesion layer 6 can be, for example, 1 nm or more and 200 nm or less.

The piezoelectric film 3 can be deposited using, for example, an alkali niobium oxide which contains potassium (K), sodium (Na), and niobium (Nb), and which is represented by a composition formula $(K_{1-x}Na_x)_yNbO_3$. That is, the piezoelectric film 3 can be deposited using potassium sodium niobate (KNN). A coefficient x [$=Na/(K+Na)$] in the above-described composition formula is a value in a range of $0<x<1$. A coefficient y [$=(K+Na)/Nb$] is preferably a value in a range of $0.7 \leq y \leq 1.50$, for example. The piezoelectric film 3 is a polycrystalline film of KNN (hereinafter also referred to as KNN-film 3). A crystal structure of KNN is a perovskite structure. A thickness of the KNN-film 3 can be, for example, 0.5 μm or more and 5 μm or less.

Preferably, crystals constituting the KNN-film 3 are preferentially oriented in (001) direction with respect to the surface of the substrate 1 (Si-substrate 1a, in a case where the substrate 1 is, for example, the Si-substrate 1a having the surface oxide film 1b, the insulating film 1d, or the like). That is, a surface of the KNN-film 3 (a surface to be a base of the top electrode film 4) is preferably mainly constituted by KNN-(001). By depositing the KNN-film 3 directly on the bottom electrode film 2 (Pt-film) oriented preferentially in (111) direction with respect to the surface of the substrate 1, the crystals constituting the KNN-film 3 can be easily preferentially oriented in (001) direction with respect to the surface of the substrate 1. That is, 80% or more crystals in a crystal group constituting the KNN-film 3 can be oriented in (001) direction with respect to the surface of the substrate 1, and 80% or more regions of the surface of the KNN-film 3 can be easily KNN-(001).

It is preferable that half or more crystals in the crystal group constituting the KNN-film 3 have a columnar structure. Boundaries between the crystals constituting the KNN-film 3, i.e., crystal grain boundaries present in the KNN-film 3 preferably penetrate in a thickness direction of the KNN-film 3. For example, the KNN-film 3 preferably has more crystal grain boundaries that penetrate in the thickness direction of the KNN-film 3 than crystal grain boundaries that do not penetrate in the thickness direction of the KNN-film 3 (e.g., crystal grain boundaries parallel to a planar direction of the substrate 1).

The KNN-film 3 contains at least one metal element (hereinafter also referred to simply as "metal element") selected from a group consisting of copper (Cu), manganese (Mn), iron (Fe), and vanadium (V). Preferably, the KNN-film 3 contains at least one metal element selected from a group consisting of Cu and Mn. "Containing at least one metal element selected from the group consisting of Cu and Mn" may include a case of containing only Cu, a case of containing only Mn, and a case of containing both Cu and Mn. The metal elements are present in a matrix phase of the crystals constituting the KNN-film 3 and at the crystal grain boundaries of the KNN-film 3. In the KNN-film 3, a B/A-value is 1.0 or less, preferably 0.8 or less, the B/A-value being a ratio of a concentration (concentration B) of the metal element present at the grain boundaries of the crystals constituting the KNN-film 3, with respect to a concentration (concentration A) of the metal element present in the matrix phase of the crystals constituting the KNN-film 3. Thus, in the KNN-film 3, the (amount of) metal element present at the grain boundaries is less than the (amount of) metal element present in the matrix phase.

Since the B/A-value is 1.0 or less, cracks are less likely to occur in the KNN-film 3 (the KNN-film 3 is less likely to break (is less likely to be damaged)). That is, since the B/A-value is 1.0 or less, occurrence of cracks in the KNN-film 3 can be suppressed even when higher electric field than a conventionally used electric field (e.g., an electric field of 1 MV/cm) is applied to the KNN-film 3. Since the B/A-value is 0.8 or less, the occurrence of cracks in the KNN-film 3 can be reliably suppressed.

The KNN-film 3 having the B/A-value of 1.0 or less can be deposited by the sputtering method using a target material comprised of a KNN-sintered material in which the above-described metal element is (previously) dissolved (solid-solved) in a matrix phase. The target material can be produced by mixing and calcining $K_2CO_3$-powder, $Na_2CO_3$-powder, $Nb_2O_5$-powder, metal powder (e.g., Cu-powder) or metal oxide powder (e.g., CuO-powder, CuzO-powder, MnO-powder) containing the above-described element, and the like. The metal element can be dissolved in the matrix phase by increasing the calcining (sintering) temperature when producing the target material, e.g., by setting the calcining temperature to 900° C. or more and 1200° C. or less, preferably 1000° C. or more and 1200° C. or less, more preferably 1100° C. or more and 1150° C. or less. That is, the target material in which the metal element is dissolved in the matrix phase, can be obtained by increasing the calcining temperature when producing the target material.

The B/A-value is preferably 0 (zero). Specifically, the above-described concentration B is preferably 0%, i.e., the metal element is preferably not present at the crystal grain boundaries of the KNN-film 3. However, according to a current technique, it is difficult to prevent the metal element from being present at the crystal grain boundaries of the KNN-film 3. Therefore, the B/A-value is more than 0.

A content of the above-described metal element in the KNN-film 3 is preferably in a range of, for example, 0.2 at % or more and 2.0 at % or less, relative to an amount of niobium in the KNN-film 3 (polycrystalline film). That is, a concentration of the above-described metal element in the KNN-film 3 is preferably, for example, 0.2 at % or more and 2.0 at % or less. The concentration of the metal element used herein indicates a total concentration of the metal element present in the matrix phase and the metal element present at the crystal grain boundaries in the KNN-film 3. That is, in the KNN-film 3, the total concentration of the metal element present in the matrix phase and the metal element present at the crystal grain boundaries is preferably, for example, 0.2 at % or more and 2.0 at % or less, relative to niobium in the KNN-film 3. Further, when the KNN-film 3 contains a plurality of the metal elements of Cu, Mn, Fe, and V, the total concentration of the metal element indicates a total concentration of the plurality of the metal elements.

Since the concentration of the metal element in the KNN-film 3 is 0.2 at % or more, it is possible to improve a resistance to fluorine-based etchants while improving an insulating property (leakage resistance) of the KNN-film 3. Since the concentration of the metal element in the KNN-film 3 is 2.0 at % or less, it is possible to easily obtain the KNN-film 3 having the B/A-value of 1.0 or less. Further, since the concentration of the metal element in the KNN-film 3 is 2.0 at % or less, it is possible to make a relative permittivity of the KNN-film 3 suitable value for applications such as sensors and actuators, and suppress a decrease in sensitivity when the KNN-film 3 is applied to sensors and an increase in power consumption when it is applied to actuators, for example.

The KNN-film 3 may also contain secondary component other than primary components such as K, Na, Nb, and the above-described metal element in a range where the effect obtained by adding the above-described metal element in the above-described range is not impaired, e.g., in a range of 5 at % or less (in a case where a plurality of the secondary components are added, a total concentration is 5 at % or less). Lithium (Li), Ta, antimony (Sb), or the like can be added as the secondary component.

An average grain size of the crystals (crystal group) constituting the KNN-film 3 (hereinafter also referred to as "average crystal grain size of the KNN-film 3") is preferably 100 nm or more, for example. The average crystal grain size of the KNN-film 3 used herein indicates an average crystal grain size in a cross-section of the KNN-film 3 in the planar direction of the substrate 1. The average crystal grain size of the KNN-film 3 can be obtained by image analysis of visual field of an image taken with a scanning electron microscope (e.g., SEM image) or an image taken with a transmission electron microscope (e.g., TEM image). For example, "ImageJ" created by Wayne Rasband can be used as an image analysis software.

The larger the average crystal grain size of the KNN-film 3, the lower the grain boundary density in the KNN-film 3, i.e., the fewer the crystal grain boundaries present in the KNN-film 3. The grain boundary density used herein indicates a value obtained by dividing a total length of the grain boundaries of the crystals in the cross-section of the KNN-film 3 in the planar direction of the substrate 1 by a cross-sectional area (=total length of the grain boundaries of the crystal grains/cross-sectional area).

Since the grain boundary density in the KNN-film 3 is low, the metal element present at the crystal grain boundaries of the KNN-film 3 can be reliably reduced, i.e., the concentration B can be reliably reduced. Thereby, the KNN-film 3 having the B/A-value of 1.0 or less can be reliably and easily obtained.

From a viewpoint of reducing the grain boundary density in the KNN-film 3, the larger average crystal grain size of the KNN-film 3 is more preferable. However, when the average crystal grain size of the KNN-film 3 is larger than the thickness of the KNN-film 3, an in-plane uniformity of piezoelectric properties may deteriorate in some cases. Therefore, from a viewpoint of suppressing the deterioration of the in-plane uniformity of the piezoelectric properties, the average crystal grain size of the KNN-film 3 is preferably smaller than the thickness of the KNN-film 3.

The top electrode film 4 can be deposited using various metals such as Pt, Au, aluminum (Al), or Cu, or an alloy of these metals, for example. The top electrode film 4 can be deposited by a method such as the sputtering method, the vapor deposition method, a plating method, or a metal paste method. The top electrode film 4 does not greatly affect the crystal structure of the KNN-film 3, unlike the bottom electrode film 2. For this reason, a material and a crystal structure of the top electrode film 4, and the method for depositing the top electrode film 4 are not particularly limited. An adhesion layer mainly containing, for example, Ti, Ta, $TiO_2$, Ni, $RuO_2$, $IrO_2$, or the like may also be provided, as necessary, between the KNN-film 3 and the top electrode film 4 in order to enhance an adhesiveness between them. A thickness of the top electrode film 4 can be, for example, 100 nm or more and 5000 nm or less. When the adhesion layer is provided, a thickness of the adhesion layer can be, for example, 1 nm or more and 200 nm or less.

(2) Configuration of Piezoelectric Device Module

Figure 3:
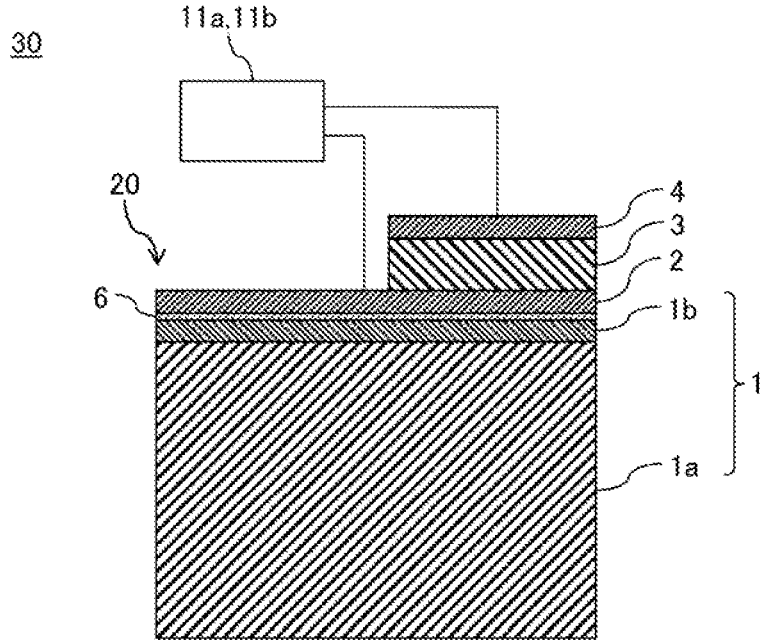
FIG. 3 is a view illustrating an example of a schematic configuration of a piezoelectric device module according to the embodiment of the present disclosure.

FIG. 3 illustrates a schematic configuration view of a device module 30 (hereinafter also referred to as piezoelectric device module 30) including the KNN-film 3 according to the present embodiment. The piezoelectric device module 30 includes an element 20 (an element 20 including the KNN-film 3; hereinafter also referred to as piezoelectric element 20) obtained by shaping the above-described piezoelectric stack 10 into a predetermined form, and at least either a voltage applicator 11a or a voltage detector 11b connected to the piezoelectric element 20. The voltage applicator 11a is a means that applies a voltage between the bottom electrode film 2 and the top electrode film 4. The voltage detector 11b is a means that detects a voltage generated between the bottom electrode film 2 and the top electrode film 4. Various known means can be used as the voltage applicator 11a and the voltage detector 11b.

The piezoelectric device module 30 can function as an actuator by connecting the voltage applicator 11a between the bottom electrode film 2 and the top electrode film 4 of the piezoelectric element 20. The KNN-film 3 can be deformed by applying a voltage between the bottom electrode film 2 and the top electrode film 4 using the voltage applicator 11a. Various structures connected to the piezoelectric device module 30 can be actuated due to the deformation motion. In this case, examples of the applications of the piezoelectric device module 30 include a head for an inkjet printer, a MEMS mirror for a scanner, and a vibrator for an ultrasonic generator.

The piezoelectric device module 30 can function as a sensor by connecting the voltage detector 11b between the bottom electrode film 2 and the top electrode film 4 of the piezoelectric element 20. Some change in physical quantity is accompanied by the deformation of the KNN-film 3, which in turn generates a voltage between the bottom electrode film 2 and the top electrode film 4. A magnitude of the physical quantity applied to the KNN-film 3 can be measured by detecting the voltage using the voltage detector 11b. In this case, examples of the applications of the piezoelectric device module 30 include an angular velocity sensor, an ultrasonic sensor, a pressure sensor, and an acceleration sensor.

(3) Method for Producing Piezoelectric Stack, Piezoelectric Element, and Piezoelectric Device Module A method for producing the above-described piezoelectric stack 10, piezoelectric element 20, and piezoelectric device module 30 will be described.

The substrate 1 is firstly prepared, and the adhesion layer 6 (Ti-layer) and the bottom electrode film 2 (Pt-film) are deposited in this order on any one of main surfaces of the substrate 1 by the sputtering method, for example. It is also acceptable to prepare the substrate 1 with the adhesion layer 6 or the bottom electrode film 2 deposited on any one of the main surfaces of the substrate 1 in advance.

The following conditions are exemplified as the conditions for providing the adhesion layer 6.

Temperature (substrate temperature): 100° ° C. or more and 500° C. or less, preferably 200° C. or more and 400° C. or less RF-power: 1000 W or more and 1500 W or less, preferably 1100 W or more and 1300 W or less Atmosphere: Argon (Ar) gas atmosphere Atmospheric pressure: 0.1 Pa or more and 0.5 Pa or less, preferably 0.2 Pa or more and 0.4 Pa or less Formation time: 30 seconds or more and 3 minutes or less, preferably 45 seconds or more and 2 minutes or less The following conditions are exemplified as the conditions for depositing the bottom electrode film 2.

Temperature (substrate temperature): 100° C. or more and 500° C. or less, preferably 200° C. or more and 400° C. or less RF-power: 1000 W or more and 1500 W or less, preferably 1100 W or more and 1300 W or less Atmosphere: Ar-gas atmosphere Atmospheric pressure: 0.1 Pa or more and 0.5 Pa or less, preferably 0.2 Pa or more and 0.4 Pa or less Deposition time: 3 minutes or more and 10 minutes or less, preferably 4 minutes or more and 8 minutes or less, more preferably 5 minutes or more and 6 minutes or less Subsequently, the KNN-film 3 is deposited on the bottom electrode film 2 by the sputtering method. A composition ratio of the KNN-film 3 can be adjusted by controlling a composition of the target material used during a sputtering deposition. The target material can be produced by mixing and calcining $K_2CO_3$-powder, $Na_2CO_3$-powder, $Nb_2O_5$-powder, metal powder or metal oxide powder containing the above-described metal element, and the like. The composition of the target material can be controlled by adjusting a mixing ratio of the $K_2CO_3$-powder, the $Na_2CO_3$-powder, the $Nb_2O_5$-powder, the metal powder or the metal oxide powder containing the above-described metal element, and the like. The KNN-film 3 containing the metal element at the above-described concentration can be deposited by using a KNN-sintered target material in which the metal powder or the metal oxide powder containing the metal element is contained at a concentration of 0.2 at % or more and 2.0 at % or less, for example.

The target material in which the metal element is dissolved in the matrix phase, is used as the target material used during the sputtering deposition. Such a target material can be produced by increasing the calcining temperature when producing the target material (e.g., 900° C. or more and 1200° C. or less, preferably 1000° C. or more and 1200° C. or less, more preferably 1100° C. or more and 1150° C. or less).

The following conditions are exemplified as the conditions for depositing the KNN-film 3.

Deposition temperature (substrate temperature): 500° C. or more and 700° C. or less, preferably 550° C. or more and 650° C. or less RF-power: 2000 W or more and 2400 W or less, preferably 2100 W or more and 2300 W or less Deposition atmosphere: Ar-gas+oxygen ($O_2$) gas atmosphere Atmospheric pressure: 0.2 Pa or more and 0.5 Pa or less, preferably 0.2 Pa or more and 0.4 Pa or less Partial pressure of Ar-gas relative to $O_2$-gas (partial pressure ratio of Ar/$O_2$): 30/1 to 20/1, preferably 27/1 to 23/1

Deposition rate: 0.5 μm/hr or more and 2 μm/hr or less, preferably 0.5 μm/hr or more and 1.5 μm/hr or less By using the target material in which the metal material is dissolved in the matrix phase, it is possible to first introduce the metal element into A-site of the KNN, and introduce the metal element overflowing from the A-site into B-site. Thus, by using the target material in which the metal element is dissolved in the matrix phase, it is possible to preferentially introduce the metal element such as Cu or Mn into the A-site or B-site, i.e., into the matrix phase of the crystals constituting the KNN-film 3, when the KNN-film 3 is deposited. As a result, the metal element present at the crystal grain boundaries of the KNN-film 3 can be reduced. Thereby, the KNN-film 3 having the B/A-value of 1.0 or less can be deposited.

Then, the top electrode film 4 is deposited on the KNN-film 3 by the sputtering method, for example. Conditions for depositing the top electrode film 4 can be similar to the above-described conditions for depositing the bottom electrode film 2. As a result, there is provided the piezoelectric stack 10 including the substrate 1, the bottom electrode film 2, the KNN-film 3, and the top electrode film 4, as illustrated in FIG. 1.

Then, the piezoelectric element 20 as illustrated in FIG. 3 is obtained by shaping the piezoelectric stack 10 into a predetermined form (i.e., by processing the piezoelectric stack 10 in a predetermined pattern) by an etching or the like, and the piezoelectric device module 30 is obtained by connecting at least either the voltage applicator 11*a* or the voltage detector 11*b* to the piezoelectric element 20. For example, a dry etching method such as a reactive ion etching or a wet etching method using a predetermined etchant can be used as the etching method.

When the piezoelectric stack 10 is shaped by the dry etching, a photoresist pattern as an etching mask for the dry etching is formed on the piezoelectric stack 10 (e.g., on the top electrode film 4) by a photolithography process or the like. A precious metal film (metal mask) such as a chromium (Cr) film, a nickel (Ni) film, a Pt-film, or a Ti-film may be formed as the etching mask by the sputtering method. Then, the dry etching is performed to the piezoelectric stack 10 (the top electrode film 4, the KNN-film 3, etc.) using a halogen element-containing gas as an etching gas. Examples of the halogen element include chlorine (Cl), fluorine (F), and the like. Boron trichloride ($BCl_3$) gas, silicon tetrachloride ($SiCl_4$) gas, chlorine ($Cl_2$) gas, $CF_4$-gas, $C_4F_8$-gas, or the like can be used as the halogen element-containing gas.

When the piezoelectric stack 10 is shaped by the wet etching, a silicon oxide ($SiO_x$) film or the like as an etching mask for the wet etching is formed on the piezoelectric stack 10 (e.g., on the top electrode film 4). Then, the wet etching is performed to the piezoelectric stack 10 (the top electrode film 4, the KNN-film 3, etc.) by immersing the piezoelectric stack 10 in an etchant containing an alkaline aqueous solution of a chelating agent and not containing hydrofluoric acid, for example. An etchant obtained by mixing ethylenediaminetetraacetic acid as the chelating agent, aqueous ammonia, and aqueous hydrogen peroxide, can be used as the etchant containing the alkaline aqueous solution containing the chelating agent and not containing hydrofluoric acid.

(4) Effects Obtained by the Present Embodiment

According to the present embodiment, the following one or more effects are obtained.

(a) Since the B/A-value of the KNN-film 3 is 1.0 or less, cracks are less likely to occur in the KNN-film 3. For example, the occurrence of cracks in the KNN-film 3 can be suppressed even when the KNN-film 3 is driven (deformed) by applying a higher electric field (e.g., electric field of 1 MV/cm) than a conventionally used electric field between the bottom electrode film 2 and the top electrode film 4.

When cracks occur in the KNN-film 3 in the piezoelectric device module 30 using the KNN-film 3, the piezoelectric device module 30 cannot be used. Therefore, a high electric field of about 1 MV/cm cannot be applied to conventional piezoelectric device modules. In contrast, cracks are less likely to occur in the KNN-film 3 in the piezoelectric device module 30 of the present embodiment even when an electric field of 1 MV/cm is applied. Thus, a higher electric field than a conventionally used electric field can be applied, thereby enhancing a versatility of the piezoelectric device module 30.

(b) Since the average crystal grain size of the KNN-film 3 is, for example, 100 nm or more, the grain boundary density in the KNN-film 3 can be reduced. Thereby, the metal element present at the crystal grain boundaries can be reliably reduced. As a result, the KNN-film 3 having the B/A-value of 1.0 or less can be reliably obtained.

(c) Since the B/A-value of the KNN-film 3 is 1.0 or less and the average crystal grain size of the KNN-film 3 is large (e.g., is 100 nm or more), the occurrence of cracks in the KNN-film 3 can be more reliably suppressed even when an electric field of 1 MV/cm, for example, is applied between the bottom electrode film 2 and the top electrode film 4. Since the B/A-value of the KNN-film 3 is 1.0 or less, at least the above-described effect (a) can be obtained even when the average crystal grain size of the KNN-film 3 is less than 100 nm.

(d) Since the KNN-film 3 contains the metal element at the concentration of, for example, 0.2 at % or more and 2.0 at % or less, the B/A-value can be 1.0 or less while simultaneously obtaining the insulating property, the resistance to fluorine-based etchants, and a property of the relative permittivity in a good balance.

OTHER EMBODIMENTS

An embodiment of the present disclosure has been described above in detail. However, the present disclosure is not limited to the above embodiment, and may be modified without departing from the gist thereof.

Although the above embodiment describes the case where the KNN-film 3 is deposited by the sputtering method, there is no limitation thereto. As long as the KNN-film 3 having the B/A-value of 1.0 or less can be deposited, the KNN-film 3 may also be deposited by a method such as a pulsed laser deposition (PLD) method or a sol-gel method, for example.

Although the above embodiment describes the case where the adhesion layer 6 is provided between the substrate 1 and the bottom electrode film 2, the adhesion layer 6 does not need to be provided.

For example, an orientation control layer that controls an orientation of the crystals constituting the KNN-film 3 may also be provided between the bottom electrode film 2 and the KNN-film 3. The orientation control layer can be formed, for example, using a material which is a metal oxide such as SRO, LNO, or strontium titanium oxide ($SrTiO_3$, abbreviated as STO), and which is different from the material constituting the bottom electrode film 2. Preferably, crystals constituting the orientation control layer are preferentially oriented in (100) with respect to the surface of the substrate 1. In a case where the bottom electrode film 2 is not provided as described in the other embodiment, the orientation control layer may be provided between the substrate 1 and the KNN-film 3. That is, the orientation control layer may be provided directly below the KNN-film 3.

For example, the KNN-film 3 may contain, in addition to or in place of the above-described metal element, another metal element having an effect equivalent to the above-described metal element so as to have 1.0 or less ratio of the concentration (concentration B) of the metal element present at the crystal grain boundaries, with respect to the concentration (concentration A) of the metal element present in the matrix phase of the crystals constituting the KNN-film 3. In this case as well, effects similar to those in the above-described embodiment are obtained.

For example, in shaping the above-described piezoelectric stack 10 into the piezoelectric element 20, the substrate 1 may be removed from the piezoelectric stack 10 as long as the piezoelectric device module 30 produced using the piezoelectric stack 10 (piezoelectric element 20) can be applied to a desired application such as a sensor or an actuator.

EXAMPLES

Experimental results supporting the effects of the above-described embodiment will be described later.

(Samples 1 to 6)

A Si-substrate with a surface in (100) direction, a thickness of 610 μm, and a diameter of 6 inches, and having a thermal oxide film (thickness: 200 nm) formed on its surface, was prepared as a substrate. Then, a piezoelectric stack was produced by depositing, on the thermal oxide film of the substrate, a Ti-layer (thickness: 2 nm) as an adhesion layer, a Pt-film (preferentially oriented in (111) direction with respect to the surface of the substrate, thickness: 200 nm) as a bottom electrode film, a KNN-film (preferentially oriented in (001) direction with respect to the surface of the substrate, thickness: 2 μm, average grain size: 120 nm, Cu-concentration: in a range from 0.2 to 2.0 at %), and a Pt-film as a top electrode film in this order. The B/A-value of the KNN-film was varied in a range from 1.3 to 0.6 by changing a target material used during a deposition of the KNN-film. Sample 1 was a piezoelectric stack having a KNN-film containing Cu as a metal element and having the B/A-value of 1.3. Sample 2 was a piezoelectric stack having a KNN-film containing Cu as the metal element and having the B/A-value of 1.1. Sample 3 was a piezoelectric stack having a KNN-film containing Cu as the metal element and having the B/A-value of 1.0. Sample 4 was a piezoelectric stack having a KNN-film containing Cu as the metal element and having the B/A-value of 0.8. Sample 5 was a piezoelectric stack having a KNN-film containing Cu as the metal element and having the B/A-value of 0.7. Sample 6 was a piezoelectric stack having a KNN-film containing Cu as the metal element and having the B/A-value of 0.6.

(Samples 7 to 12)

A Si-substrate with a surface in (100) direction, a thickness of 610 μm, and a diameter of 6 inches, and having a thermal oxide film (thickness: 200 nm) formed on its surface, was prepared as a substrate. Then, a piezoelectric stack was produced by depositing, on the thermal oxide film of the substrate, a Ti-layer (thickness: 2 nm) as an adhesion layer, a Pt-film (preferentially oriented in (111) direction with respect to the surface of the substrate, thickness: 200 nm) as a bottom electrode film, a KNN-film (preferentially oriented in (001) direction with respect to the surface of the substrate, thickness: 2 μm, average grain size: 120 nm, Mn-concentration: in a range from 0.2 to 2.0 at %), and a Pt-film as a top electrode film in this order. The B/A-value of the KNN-film was varied in a range from 1.3 to 0.6 by changing a target material used during a deposition of the KNN-film. Sample 7 was a piezoelectric stack having a KNN-film containing Mn as the metal element and having the B/A-value of 1.3. Sample 8 was a piezoelectric stack having a KNN-film containing Mn as the metal element and having the B/A-value of 1.1. Sample 9 was a piezoelectric stack having a KNN-film containing Mn as the metal element and having the B/A-value of 1.0. Sample 10 was a piezoelectric stack having a KNN-film containing Mn as the metal element and having the B/A-value of 0.8. Sample 11 was a piezoelectric stack having a KNN-film containing Mn as the metal element and having the B/A-value of 0.7. Sample 12 was a piezoelectric stack having a KNN-film containing Mn as the metal element and having the B/A-value of 0.6.

(Production Conditions)

For samples 1 to 12, the Ti-layer was formed by RF-magnetron sputtering method under the following conditions.

Temperature: 300° C.
RF-power: 1200 W
Gas: Ar-gas
Ar-gas atmospheric pressure: 0.3 Pa
Time: 1 minute For samples 1 to 12, the Pt-films (bottom electrode film and top electrode film) were deposited by RF-magnetron sputtering method under the following conditions.

Deposition temperature: predetermined temperature in a range of 100° C. or more and 500° C. or less
RF-power: 1200 W
Gas: Ar-gas
Ar-gas atmospheric pressure: 0.3 Pa
Time: 5 minutes For the samples 1 to 12, the KNN-film was deposited by RF-magnetron sputtering method under the following conditions.

Temperature: 600° C.
RF-power: 2200 W
Gas: $Ar+O_2$ mixed gas
$Ar+O_2$ mixed gas atmospheric pressure: 0.3 Pa
Partial pressure of Ar-gas relative to $O_2$-gas (partial pressure ratio of $Ar/O_2$): 25/1 Deposition rate: 1 μm/hr For samples 1 to 6, a $(K_{1-x}Na_x)NbO_3$ sintered material having a composition of (K+Na)/Nb=0.7 to 1.5 and Na/(K+Na)=0.4 to 0.7 and containing Cu at a concentration in a range from 0.2 to 2.0 at %, was used as a sputtering target material for depositing the KNN-film. The target material was produced as follows: $K_2CO_3$-powder, $Na_2CO_3$-powder, $Nb_2O_5$-powder, and CuO-powder were mixed for 24 hours using a ball mill, the mixture was provisionally calcined for 10 hours in a temperature range of 850° C. or more and 1000° C. or less, then pulverized using again the ball mill, and molded under a pressure of 200 MPa, and thereafter calcined in a temperature range of 1080° C. or more and 1150° C. or less. A composition of the target material and the Cu-concentration in the target material were controlled by adjusting a mixing ratio of the $K_2CO_3$-powder, $Na_2CO_3$-powder, $Nb_2O_5$-powder, and CuO-powder, and were measured by EDX (Energy Dispersive X-ray spectroscopy) before the deposition process was performed.

For samples 7 to 12, a $(K_{1-x}Na_x)NbO_3$ sintered material having a composition of (K+Na)/Nb=0.7 to 1.5 and Na/(K+Na)=0.4 to 0.7 and containing Mn at a concentration in a range from 0.2 to 2.0 at %, was used as a sputtering target material for depositing the KNN-film. The target material was produced as follows: $K_2CO_3$-powder, $Na_2CO_3$-powder, $Nb_2O_5$-powder, and MnO-powder were mixed for 24 hours using a ball mill, the mixture was provisionally calcined for 10 hours in a temperature range of 850° C. or more and 1000° C. or less, then pulverized using again the ball mill, and molded under a pressure of 200 MPa, and thereafter calcined in a temperature range of 1080° C. or more and 1150° C. or less. A composition of the target material and the Mn-concentration in the target material were controlled by adjusting a mixing ratio of the $K_2CO_3$-powder, $Na_2CO_3$-powder, $Nb_2O_5$-powder, and MnO-powder, and were measured by EDX (Energy Dispersive X-ray spectroscopy) before the deposition process was performed.

(Evaluation of Crack Occurrence)

A plurality of piezoelectric elements with an element area ø of 0.5 mm were produced from sample 1. Each of an electric field of 500 kV/cm and an electric field of 1 MV/cm was applied to the plurality of piezoelectric elements produced from sample 1, and it was evaluated whether or not cracks occurred in the KNN-film. A piezoelectric element with even one crack occurring in its KNN-film was evaluated as "crack occurrence element". A crack occurrence ratio (%) was calculated by the following (Equation 1). The calculation results are as shown in Table 1. (Equation 1)
Crack occurrence ratio (%)=(number of crack occurrence elements/number of evaluated elements)×100

Evaluation of crack occurrence was also conducted for samples 2 to 12, as with sample 1. That is, a plurality of piezoelectric elements were produced from each of samples 2 to 12, each of an electric field of 500 kV/cm and an electric field of 1 MV/cm was applied to the plurality of produced piezoelectric elements, and the crack occurrence ratio was calculated, as with sample 1. The calculation results are as shown in Table 1.

TABLE 1

| SAMPLE No. | METAL ELEMENT ADDED | B/A-VALUE | CRACK OCCURRENCE RATIO (%) | |
|---|---|---|---|---|
| | | | 500 kV/cm | 1 MV/cm |
| 1 | Cu | 1.3 | 70 | 100 |
| 2 | Cu | 1.1 | 30 | 100 |
| 3 | Cu | 1.0 | 0 | 5 |
| 4 | Cu | 0.8 | 0 | 0 |
| 5 | Cu | 0.7 | 0 | 0 |
| 6 | Cu | 0.6 | 0 | 0 |
| 7 | Mn | 1.3 | 68 | 100 |
| 8 | Mn | 1.1 | 32 | 100 |
| 9 | Mn | 1.0 | 0 | 4 |
| 10 | Mn | 0.8 | 0 | 0 |
| 11 | Mn | 0.7 | 0 | 0 |
| 12 | Mn | 0.6 | 0 | 0 |

As shown in Table 1, for sample 3, it was confirmed that the crack occurrence ratio was 0% when the electric field of 500 kV/cm was applied, and the crack occurrence ratio was 5% when the electric field of 1 MV/cm was applied. For sample 8, it was confirmed that the crack occurrence ratio was 0% when the electric field of 500 kV/cm was applied, and the crack occurrence ratio was 4% when the electric field of 1 MV/cm was applied. For samples 4 to 6 and 10 to 12, it was confirmed that the crack occurrence ratio was 0% both when the electric field of 500 kV/cm was applied and when the electric field of 1 MV/cm was applied.

Thus, it was found that the KNN-film contains at least one metal element selected from the group consisting of Cu and Mn and the B/A-value of the KNN-film is 1.0 or less, thereby suppressing the occurrence of cracks in the KNN-film. It was also found that the B/A-value is 0.8 or less, thereby reliably suppressing the occurrence of cracks in the KNN-film even when a high electric field of 1 MV/cm was applied.

In contrast, for samples 1, 2, 7, and 8, it was confirmed that the crack occurrence ratio was 30% or more when the electric field of 500 kV/cm was applied, and the crack occurrence ratio was 100% when the electric field of 1 MV/cm was applied. That is, it was confirmed that, when the B/A-value is more than 1.0, cracks occurred in some cases only even when the electric field of 500 kV/cm was applied, and cracks occurred in all the elements when the electric field of 1 MV/cm was applied.

Preferred Aspects of the Present Disclosure

Preferred aspects of the present disclosure will be described later.

(Supplementary Description 1)

According to an aspect of the present disclosure, there is a provided a piezoelectric film, being a polycrystalline film comprised of potassium sodium niobate;

containing at least one metal element selected from a group consisting of Cu and Mn; and having 1.0 or less ratio (B/A-value) of a concentration B of the metal element at grain boundaries of crystals, with respect to a concentration A of the metal element in a matrix phase of the crystals.

(Supplementary Description 2)

Preferably, there is provided the piezoelectric film of the supplementary description 1, wherein the ratio (the B/A-value) of the concentration B, with respect to the concentration A, is 0.8 or less.

(Supplementary Description 3)

Preferably, there is provided the piezoelectric film of the supplementary description 1 or 2, wherein a total concentration of the metal element present in the matrix phase of the crystals and the metal element present at the grain boundaries of the crystals is 0.2 at % or more and 2.0 at % or less relative to an amount of niobium in the polycrystalline film.

(Supplementary description 4)

Preferably, there is provided the piezoelectric film of any one of the supplementary descriptions 1 to 3, wherein the piezoelectric film is constituted by crystal grains having an average grain size of 100 nm or more.

(Supplementary Description 5)

According to another aspect of the present disclosure, there is provided a piezoelectric stack, including:

a substrate;

an electrode film (bottom electrode film) provided on the substrate; and a piezoelectric film provided on the electrode film, the piezoelectric film being a polycrystalline film comprised of potassium sodium niobate, wherein the piezoelectric film contains at least one metal element selected from a group consisting of Cu and Mn, and a ratio (B/A-value) of a concentration B of the metal element at grain boundaries of crystals constituting the piezoelectric film, with respect to a concentration A of the metal element in a matrix phase of the crystals, is 1.0 or less.

(Supplementary Description 6)

According to further another aspect of the present disclosure, there is provided a piezoelectric element or a piezoelectric device module, including:

a substrate;

a bottom electrode film provided on the substrate;

a piezoelectric film provided on the bottom electrode film, the piezoelectric film being a polycrystalline film comprised of potassium sodium niobate; and a top electrode film provided on the piezoelectric film, wherein the piezoelectric film contains at least one metal element selected from a group consisting of Cu and Mn, and a ratio of a concentration B of the metal element at grain boundaries of crystals constituting the piezoelectric film, with respect to a concentration A of the metal element in a matrix phase of the crystals, is 1.0 or less.

(Supplementary Description 7)

Preferably, there is provided the piezoelectric element or piezoelectric device module of the supplementary description 6, wherein at least either a voltage applicator or a voltage detector is connected between the bottom electrode film and the top electrode film.

(Supplementary description 8)

According to further another aspect of the present disclosure, there is provided a method for producing a piezoelectric stack, including:

depositing an electrode film on a substrate; and depositing a piezoelectric film on the electrode film, the piezoelectric film being a polycrystalline film comprised of potassium sodium niobate, wherein in the deposition of the piezoelectric film, the piezoelectric film is deposited by a sputtering method using a target material in which at least one metal element selected from a group consisting of Cu and Mn is dissolved in a matrix phase, the piezoelectric film having 1.0 or less ratio of a concentration B of the metal element at grain boundaries of crystals constituting the piezoelectric film, with respect to a concentration A of the metal element in a matrix phase of the crystals.

REFERENCE SIGNS LIST

1 Substrate
3 Piezoelectric film
10 Piezoelectric stack

The invention claimed is:

1. A piezoelectric film, wherein the piezoelectric film is sputtered film comprising potassium sodium niobate and Mn;

the piezoelectric film is a polycrystalline film comprising a matrix phase and crystalline grains; and a ratio of a concentration B of Mn at grain boundaries of the crystalline grains of the polycrystalline film, with respect to a concentration A of Mn in the matrix phase of the polycrystalline film is more than 0 and 1.0 or less.

2. The piezoelectric film according to claim 1, wherein the ratio of the concentration B, with respect to the concentration A, is more than 0 and 0.8 or less.

3. The piezoelectric film according to claim 1, wherein a total concentration of Mn in the matrix phase at the grain boundaries of the crystalline grains is 0.2 at % or more and 2.0 at % or less relative to an amount of niobium in the polycrystalline film.

4. The piezoelectric film according to claim 1, wherein the crystal grains have an average grain size of 100 nm or more.

5. A piezoelectric stack, comprising:

a substrate;

an electrode film on the substrate; and a piezoelectric film on the electrode film, the piezoelectric film being a sputtered film comprising of potassium sodium niobate and Mn, wherein the piezoelectric film is a polycrystalline film comprising a matrix phase and crystalline grains;

80% or more of the crystalline grains of the piezoelectric film are oriented in (001) direction with respect to a surface of the substrate; and a ratio of a concentration B of Mn at grain boundaries of the crystalline grains of the piezoelectric film, with respect to a concentration A of Mn in the matrix phase of the crystals, is more than 0 and 1.0 or less.

6. A piezoelectric element, comprising:

a substrate;

a bottom electrode film provided on the substrate;

a piezoelectric film at the bottom electrode film, the piezoelectric film being a sputtered film comprising potassium sodium niobate and Mn; and a top electrode film on the piezoelectric film, wherein the piezoelectric film is a polycrystalline film comprising a matrix phase and crystalline grains;

80% or more of the crystalline grains of the piezoelectric film are oriented in (001) direction with respect to a surface of the substrate; and a ratio of a concentration B of Mn at grain boundaries of the crystalline grains of the piezoelectric film, with respect to a concentration A of Mn in the matrix phase of the crystals, is more than 0 and 1.0 or less.

7. A method for producing a piezoelectric stack, comprising:

depositing an electrode film on a substrate; and depositing by sputtering a piezoelectric film on the electrode film, wherein the piezoelectric film comprises potassium sodium niobate and Mn, the piezoelectric film is a polycrystalline film comprising a matrix phase and crystalline grains;

80% or more of the crystalline grains of the piezoelectric film are oriented in (001) direction with respect to a surface of the substrate; and the piezoelectric film has a concentration B of Mn at grain boundaries of the crystalline grains of the piezoelectric film, with respect to a concentration A of Mn in the matrix phase of the piezoelectric film.

8. The piezoelectric stack according to claim 5, wherein the ratio of the concentration B, with respect to the concentration A, is more than 0 and 0.8 or less.

9. The piezoelectric stack according to claim 5, wherein a total concentration of Mn in the matrix phase and at the grain boundaries of the crystalline grains is 0.2 at % or more and 2.0 at % or less relative to an amount of niobium in the polycrystalline film.

10. The piezoelectric stack according to claim 5, wherein the crystal grains have an average grain size of 100 nm or more.

11. The piezoelectric element according to claim 6, wherein the ratio of the concentration B, with respect to the concentration A, is more than 0 and 0.8 or less.

12. The piezoelectric element according to claim 6, wherein a total concentration of Mn in the matrix phase and at the grain boundaries of the crystalline grains is 0.2 at % or more and 2.0 at % or less relative to an amount of niobium in the polycrystalline film.

13. The piezoelectric element according to claim 6, wherein the crystal grains have an average grain size of 100 nm or more.

14. The method according to claim 7, wherein the ratio of the concentration B, with respect to the concentration A, is more than 0 and 0.8 or less.

15. The method according to claim 7, wherein a total concentration of Mn in the matrix phase and at the grain boundaries of the crystalline grains is 0.2 at % or more and 2.0 at % or less relative to an amount of niobium in the polycrystalline film.

16. The method according to claim 7, wherein the crystal grains have an average grain size of 100 nm or more.

* * * * *